(12) United States Patent
Cariello et al.

(10) Patent No.: US 10,614,899 B2
(45) Date of Patent: Apr. 7, 2020

(54) PROGRAM PROGRESS MONITORING IN A MEMORY ARRAY

(71) Applicant: Micron Technology, Inc., Boise, ID (US)

(72) Inventors: Giuseppe Cariello, Boise, ID (US); Antonino Pollio, Vico Equense (IT); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/022,959

(22) Filed: Jun. 29, 2018

(65) Prior Publication Data

US 2020/0005880 A1    Jan. 2, 2020

(51) Int. Cl.
| | |
|---|---|
| *G11C 16/06* | (2006.01) |
| *G11C 16/34* | (2006.01) |
| *G11C 16/08* | (2006.01) |
| *G11C 16/14* | (2006.01) |
| *G11C 16/26* | (2006.01) |

(52) U.S. Cl.
CPC .......... *G11C 16/3459* (2013.01); *G11C 16/08* (2013.01); *G11C 16/14* (2013.01); *G11C 16/26* (2013.01)

(58) Field of Classification Search
CPC ..... G11C 16/3459; G11C 16/08; G11C 16/14; G11C 16/26
USPC ............ 365/185.22, 185.24, 185.03, 185.21
See application file for complete search history.

(56) References Cited

U.S. PATENT DOCUMENTS

| | | | |
|---|---|---|---|
| 8,023,336 B2* | 9/2011 | Thiruvengadam | G11C 8/06 365/185.22 |
| 9,343,171 B1* | 5/2016 | Sun | G11C 16/3445 |
| 2003/0218907 A1* | 11/2003 | Yano | G11C 11/5628 365/185.03 |
| 2008/0304317 A1* | 12/2008 | Roohparvar | G11C 11/5628 365/185.03 |

* cited by examiner

*Primary Examiner* — Connie C Yoha
(74) *Attorney, Agent, or Firm* — Schwegman Lundberg & Woessner, P.A.

(57) ABSTRACT

A memory device comprises a memory array including multi-level memory cells, buffer circuitry, a memory control unit and a program progress indicator. The memory control unit is operatively coupled to the memory array and configured to load first data into the buffer circuitry and program the multi-level memory cells with the first data using multiple programming passes to program multiple programming levels. The program progress indicator is configured to indicate completion of a programming level as the programming of the multiple programming levels progresses. The memory control unit is further configured to load second data for programming of the multi-level memory cells according to an indication of completion of the program progress indicator.

25 Claims, 5 Drawing Sheets

PROGRAM PROGRESS MONITORING IN A MEMORY ARRAY

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Quality of Service (QoS) is becoming more important in managed memory systems, particularly for memory systems with NVM devices, such as NAND flash devices, etc. QoS can depend on the latency distribution in small read operations issued by an application of a host device (e.g., a processor). To reduce latency to meet QoS requirements, some managed memory systems suspend the program and erase operations to service the requested reads. However, due to limitations on page buffering, it is not possible to suspend a cache program operation after the next memory is loaded in the buffer.

Figure 1:
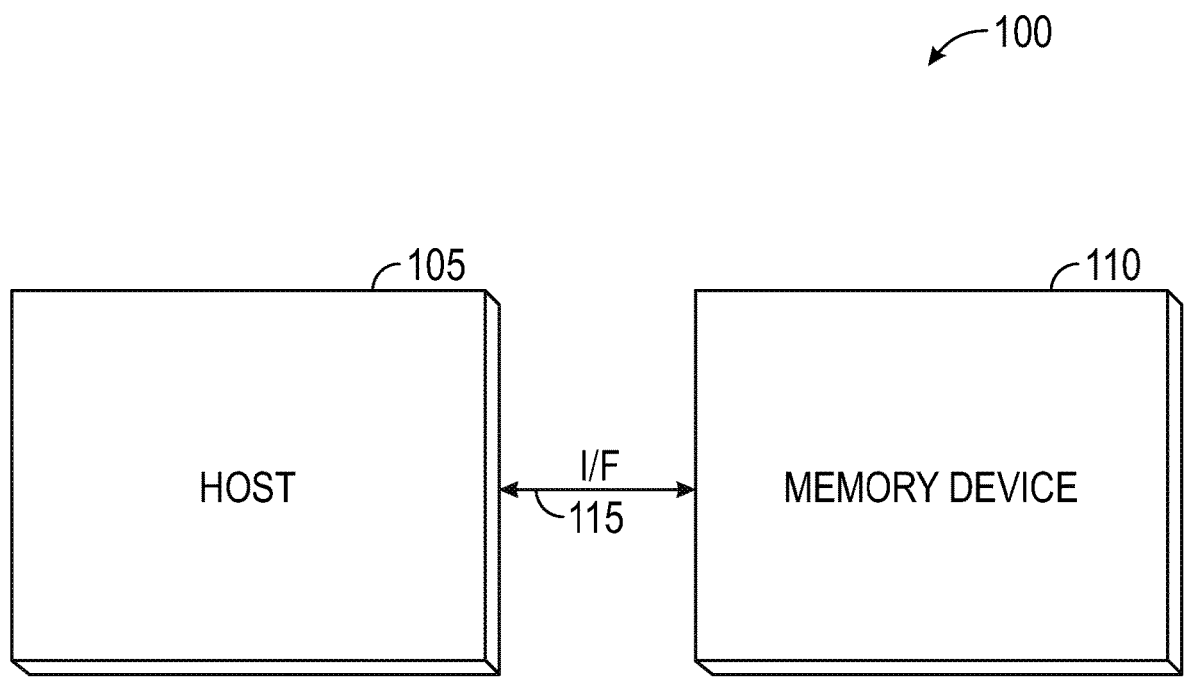
FIG. 1 illustrates an example system including a host device and a memory device.

FIG. 1 illustrates an example system 100 including a host 105 and a memory device 110. The host 105 can include a host processor, a central processing unit, or one or more other device, processor, or controller. The memory device 110 can include a universal flash storage (UFS) device, an embedded MMC (eMMC) device, or one or more other memory devices. The host 105 and the memory device 110 can communicate using a communication interface (I/F) 115 (e.g., a bidirectional parallel or serial communication interface).

In an example, the memory device 110 can include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC device, and the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the memory device 110 can include one or more other memory devices, or the communication interface 115 can include one or more other interfaces, depending on the host 105 and the memory device 110.

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory controller, and in certain embodiments, an interface circuit between the memory array and the memory controller. In certain embodiments, the memory array can include a number of memory die, each having control logic separate from the memory controller. The memory controller can include an application specific integrated circuit (ASIC), a field programmable gate array (FPGA), or one or more other processing circuits arranged or programmed to manage data transfers or operations to, from, or within the memory array.

Figure 2:
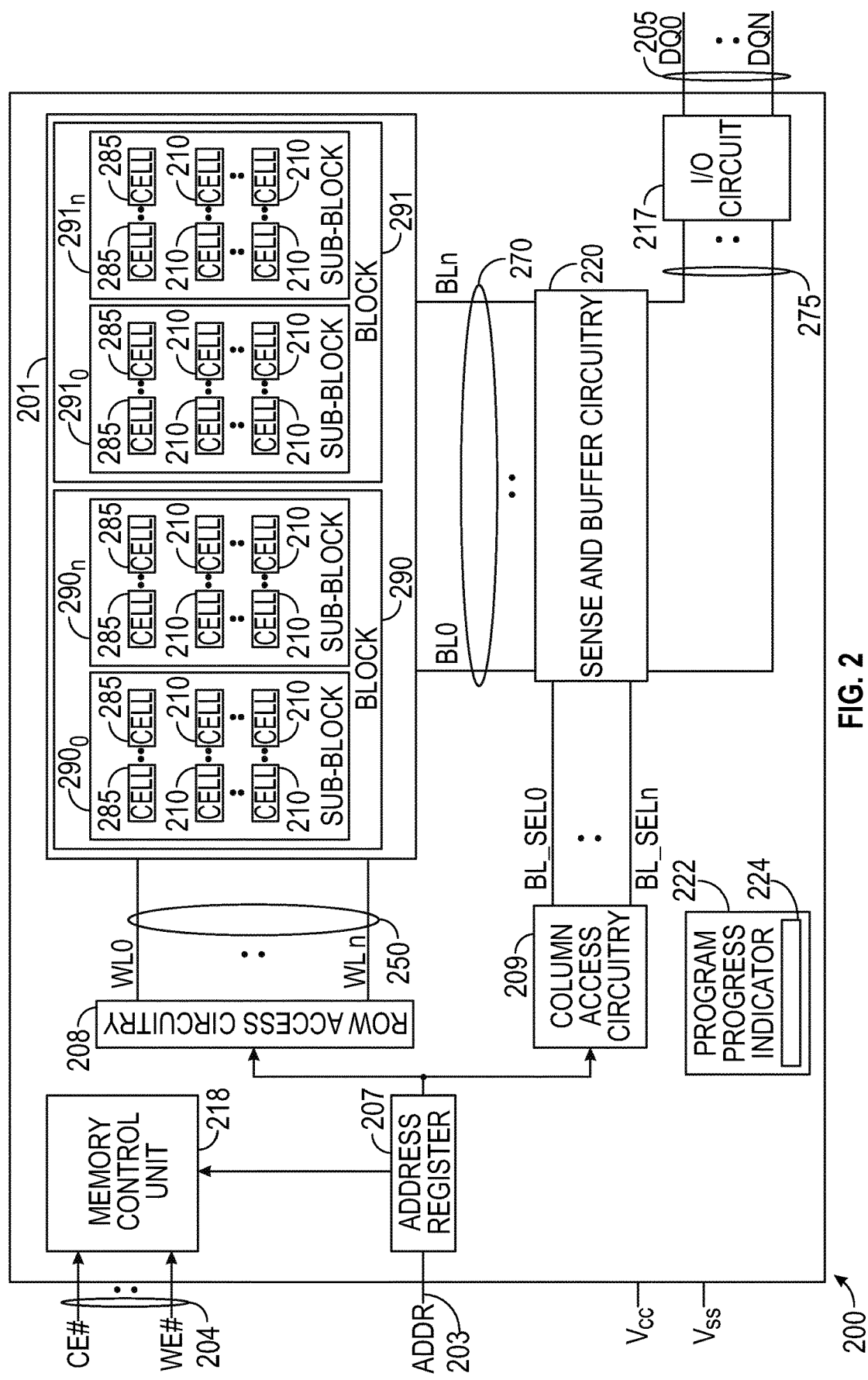
FIG. 2 shows a block diagram of a memory device.

FIG. 2 shows a block diagram of an apparatus in the form of a memory device 200 including non-volatile memory cells having mixed memory cell types integrated in the same integrated circuit (IC) chip, according to some embodiments described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include components such as a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE#, a write enable signal WE#) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed to store information representing a value of a fraction of a bit, a value of a single bit, or a value of multiple bits such as two, three, four, or another number of bits. For example, each of memory cells 210 can be programmed to store information representing a binary value "0" or "1" of a single bit. The single bit per cell is sometimes called a single-level cell. In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

In memory device 200, memory cells 210 can be configured to store information (e.g., user data). Memory cells 285 may not be configured to permanently store information such as user information, but they may be used by memory device 200 as temporary storage cells during an operation (e.g., a write operation) of storing information (e.g., user data) in memory cells 210 in order to improve operations of memory device 200.

Figures 3A, 3B:
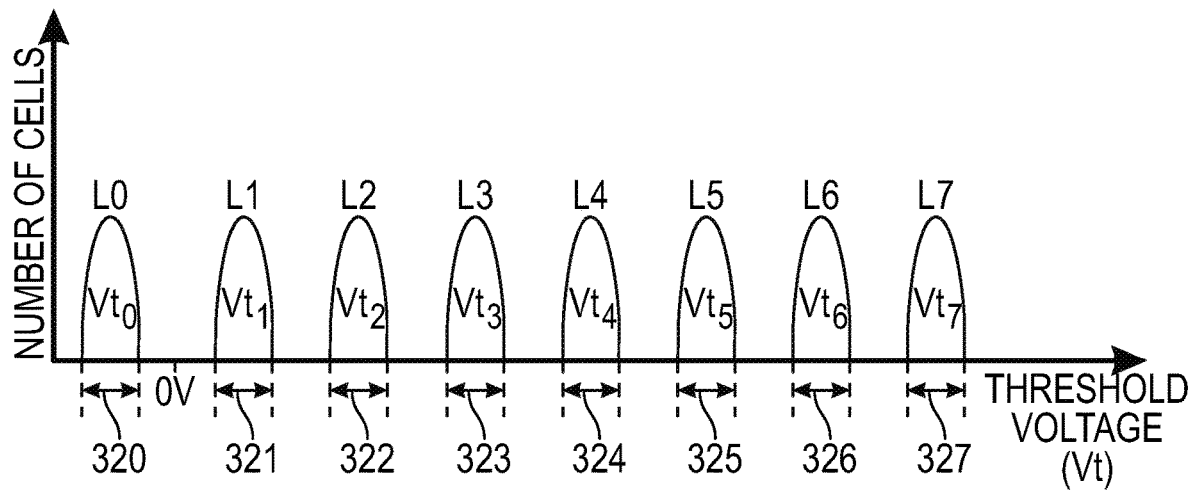
FIG. 3A shows an example of threshold voltage value ranges for multi-level memory cells.
FIG. 3B is an example chart (e.g., a table) showing threshold voltages and corresponding values of bits.

FIG. 3A shows an example of threshold voltage value ranges 320 through 327 of corresponding threshold voltages $Vt_0$ through $Vt_7$ of memory cells 210 and 285 of memory device 200 of FIG. 2, according to some embodiments described herein. Each of memory cells 210 and 285 is configured to store more than one bit of information. FIG. 3A shows an example of threshold voltage value ranges 320 through 327 for memory cells configured to store three bits (e.g., bits B0, B1, and B2) of information. FIG. 3A shows eight levels (level 0 (L0) through level 7 (L7)) corresponding to eight different combinations of three bits. Level L0 can be called an erase level (e.g., erase state). Each of levels L0 through L7 has a threshold voltage value range for a large number of memory cells. Other numbers of bits and levels can be used in the programming (e.g., two bits for four levels, or four bits for sixteen levels).

Each of threshold voltages $Vt_0$ through $Vt_7$ has a value (analog voltage value) within a corresponding threshold voltage value range. For example, threshold voltage $Vt_1$ can be any value (a positive voltage value in volt unit) within threshold voltage value range 321, and threshold voltage $Vt_7$ can be any value (a positive voltage value in volt unit) within threshold voltage value range 327.

As shown in FIG. 3A, the values of threshold voltages $Vt_0$ through $Vt_7$ can go from a value within a lowest value range (threshold voltage value range 320 corresponding to level L0) to a value within a highest threshold voltage value range (threshold voltage value range 327 corresponding to level L7). Thus, the value of threshold voltage $Vt_7$ is greatest among the values of threshold voltages $Vt_0$ through $Vt_7$. The value of each of threshold voltage $Vt_0$ through $Vt_7$ can be used to represent a value (binary value) of a combination of three bits of information. L0 can be considered as an erase level.

FIG. 3B is an example chart (e.g., a table) showing threshold voltages $Vt_0$ through $Vt_7$ (eight different threshold voltages) and corresponding values (eight combinations of binary values) of three bits B0, B1, and B2 according to some embodiments described herein. For example, the values (e.g., in volt units) of threshold voltages $Vt_0$ through $Vt_7$ can be used to represent values (binary values) 000, 001, 010, 011, 100, 101, 110, and 111, respectively, of bits B0, B1, and B2. FIG. 3B shows the values of threshold voltages $Vt_0$ through $Vt_7$ being assigned to (e.g., mapped to) values (000 through 111) of bits B0, B1, and B2 in a sequential order (sequentially from a lower binary value to a higher binary value), as an example. However, the values of threshold voltages $Vt_0$ through $Vt_7$ can be assigned to values of bits B0, B1, and B2 in any order (e.g., non-sequential order).

Based on the chart in FIG. 3B, during a write operation, the target value (analog value) for the threshold voltage of a selected memory cell (one of memory cells 210 and 285 in FIG. 2) is based on the value (binary value) of bits B0, B1, and B3 to be stored in that selected memory cell. For example, if three bits (B0, B1, and B2) having a value binary value of "100" are to be stored in the selected memory, then memory device 100 can cause (e.g., program) the threshold voltage of that selected memory cell to be the value of threshold voltage $Vt_4$ ("100"=$Vt_4$ based on the chart in FIG. 3B).

Returning to in FIG. 2, the memory control unit 218 may load a page of data to be programmed in the sense and buffer circuitry 220. The programming algorithm performed by the memory control unit 218 may begin with programming the memory cells to be written to L0 in an erase cycle. Memory cells can be written one memory page at a time or multiple memory pages at a time. Successive programming passes can be used to program the memory cells with data. The first pass may program all the bits to be programmed to L1 (or $Vt_1$). The programming, or placing, of all the L1 bits can be verified before moving on to the L2 bits. For memory cells for which programming to $Vt_1$ could not be verified, the memory controller may try to place an increased $Vt_1$ in these memory cells. This change in $Vt_1$ plus the variation in the memory cells can produce the threshold voltage range of $Vt_1$ shown in FIG. 3A. Programming or placement of the threshold voltage in the cells then progresses through placing the L2 through L7 threshold levels to complete programming the memory cells.

As explained previously herein, some managed memory systems suspend program and erase operations to service requested reads to meet QoS requirements. However, due to limitations on page buffering, it is not possible to suspend a cache program operation after the next memory page is loaded in the buffer. To keep latency in read operations low, the memory control unit 218 delays the inputs of the next page as close as possible to the end of the programming of the current page. However, finding the optimal delay in loading data can be time consuming and costly. Additionally, a fixed delay may be impractical. Even after an optimal delay for a design is determined, the optimal delay for a particular implementation can vary with silicon, temperature, voltage, and can change with memory cell aging.

Figure 4:
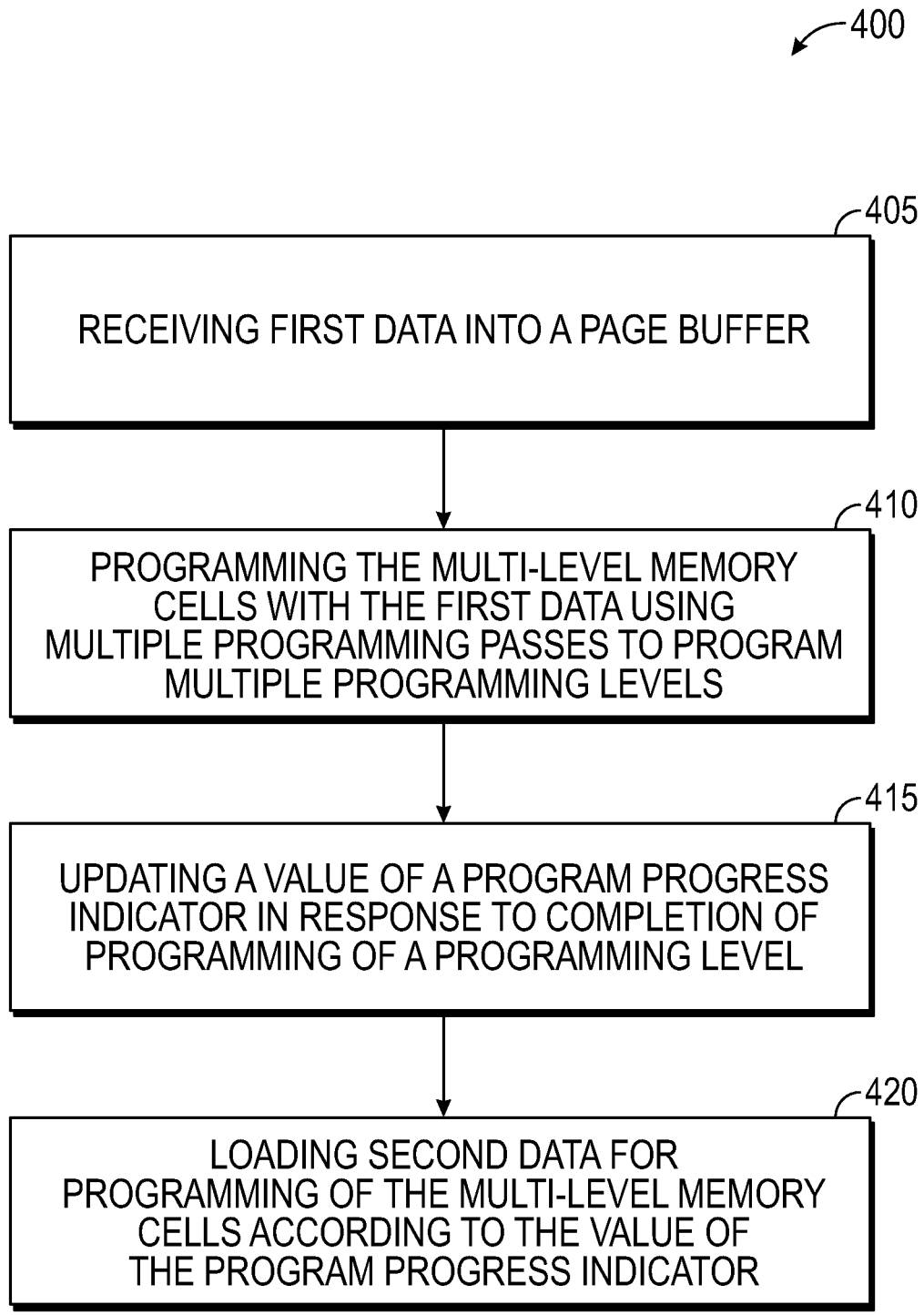
FIG. 4 is a flow diagram of a method of programming multi-level memory cells of a memory array.

FIG. 4 is a flow diagram of a method 400 of programming multi-level memory cells of a memory array, such as memory array 201 of FIG. 2. The method can be performed using the memory control unit 218 of FIG. 2. At 405, the memory control unit 218 initiates or causes first data to be loaded into a page buffer. The page buffer can be included in the sense and buffer circuitry 220 of FIG. 2.

At 410, the memory control unit 218 programs the multi-level memory cells with the first data using multiple programming passes to program multiple programming levels. Different portions of the multi-level memory cells are programmed or placed to different voltage thresholds (Vt). The memory device 200 includes a program progress indicator 222. The program progress indicator 222 indicates completion of a programming level as the programming of the multiple programming levels progresses.

Returning to FIG. 4 at 415, the program progress indicator provides a value corresponding to a programming level that has been completed, and the value of the program progress indicator is updated in response to completion of programming of a programming level. The value may be a count of the programming levels. For example, if seven voltage thresholds are to be programmed as in FIG. 3A, the program progress indicator 222 indicates a value of "0" before programming starts, and indicates a value of "1" when the programming of all the cells to be programmed to level one (L1) is completed, indicates a value of "2" when the programming of all the cells to be programmed to L2 is completed, and so on to a value of "7" when the programming of all the cells to be programmed to L7 is completed. The value of the program progress indicator may be updated in response to verification of the voltage threshold of the memory cells.

At 420, the memory control unit 218 causes second data to be loaded into the page buffer for programming of the multi-level memory cells according to the value of the program progress indicator. The new (second) data may be loaded when the program progress indicator indicates that the programming of the final programming level is complete. In some embodiments, the new data may be loaded before the final level indication in anticipation of the completion. For example, the new data may be loaded into the page buffer when the value of the program indicator is a value of "6" indicating that placement of the $Vt_6$ cells is completed rather than the $Vt_7$ cells. In certain embodiments, the new data may be loaded when the program progress indicator indicates a value of "6" and a specified number of program passes for L7 have performed.

In some embodiments, the program progress indicator 222 includes a program progress register 224 and logic circuitry. The program progress register 224 holds a value corresponding to a programming level that has been completed. The logic circuitry updates the value of the program progress register 224 upon completion of each programming level. For example, the program progress register may include eight bits, and the logic circuitry sets bits of the program progress register to "1" as the programming levels are completed. For example, the logic circuitry may set the value of the program progress register 224 to "01" at the beginning of the programming operation. The logic circuitry may then set the value to "03" when all the memory cells to be programmed to L1 have been successfully placed.

When the L1 cells are programmed the memory control unit moves on to program the L2 cells. The logic circuitry may set the value to "07" when all the memory cells to be programmed to L2 have been successfully placed. If there are seven threshold levels to place, the process continues through placement of levels L3 to L7 and updates a bit of the program progress register as the programming progresses. When all the memory cells of the final programming level (e.g., L7) are placed, the logic circuitry may set the value of the program progress indicator to "FF." In certain embodiments, one bit of the program progress register can be designated as a READY bit. The memory control unit 218 loads new data for programming (e.g., into a page buffer) in response to assertion of the READY bit. In an example, the most significant bit of the register indicating completion of the final level (e.g., L7) can be the READY bit, but any bit of the register can be designated as the READY bit to trigger loading upon completion of any of the programming levels.

This placement of the memory cells to each program level may take multiple programming passes. The program progress register 224 may include additional bits to track (e.g., count) the number of programming passes needed to complete all or each of the programming levels. These bits or count can be read to monitor the status the memory array and provide information related to failure of memory cells. The memory control unit 218 may route write data away from memory cells that have a longer write-and-verify latency.

The program progress indicator 222 may be updated when less than all of the memory cells to be programmed are verified. In certain embodiments, the program progress indicator is updated when a specified percentage (e.g., 50%) of the memory cells to placed are verified. In certain embodiments, the program progress indicator is updated when all the memory cells for a level are successfully placed except those cells allowed to fail programming. For the register example, for L1 the logic circuitry may map the advancement of a bit of the program progress register 224 to a "1" based on a "forgive" or a "give up" status of the cell $Vt_1$ distribution.

As explained previously herein, the memory control unit may place levels zero through seven (L0 through L7) with L0 considered as an erase level. For the register example, the logic circuitry does not set the value of the program progress register to "01" until verification of placement of at least a portion of the cells to L0. Thus, the program progress indicator 222 may also indicate the progress of erasure of the memory cells. In certain embodiments, the program progress indicator 222 may track the number of passes needed to erase the memory cells.

According to some embodiments, the program progress indicator 222 provides a voltage to the memory control unit 218, and changes the voltage to indicate the level of completion of the programming. For example, the program progress indicator 222 may provide zero volts at an input to the memory control unit 218 to indicate that programming is not started and place one of eight voltage steps on the input corresponding to programming levels L0 to L7. In certain embodiments, the program progress indicator 222 includes a digital-to-analog converter (DAC) to generate the voltage steps corresponding to the placement levels.

Using a program progress indicator 222 can keep latency in memory operations low. The loading of the next memory page is delayed as close as possible to the end of the programming of the current page. The program progress indicator 222 triggers the loading of the next page of data with a minimized delay that adapts automatically to variation in silicon, temperature, voltage, and NAND aging. This reduces latency due to suspended operations because the chance that data is sent too early is reduced, and this increases program performance because the chance that data is set too late is reduced.

The program progress indicator can be used to track extra information (e.g., number of programming passes needed) useful in the case of program failure or erase failure, or to characterize the failure. The memory control unit 218 may change operation of the memory device based on the extra information, such as by routing to different areas of memory for example.

Figure 5:
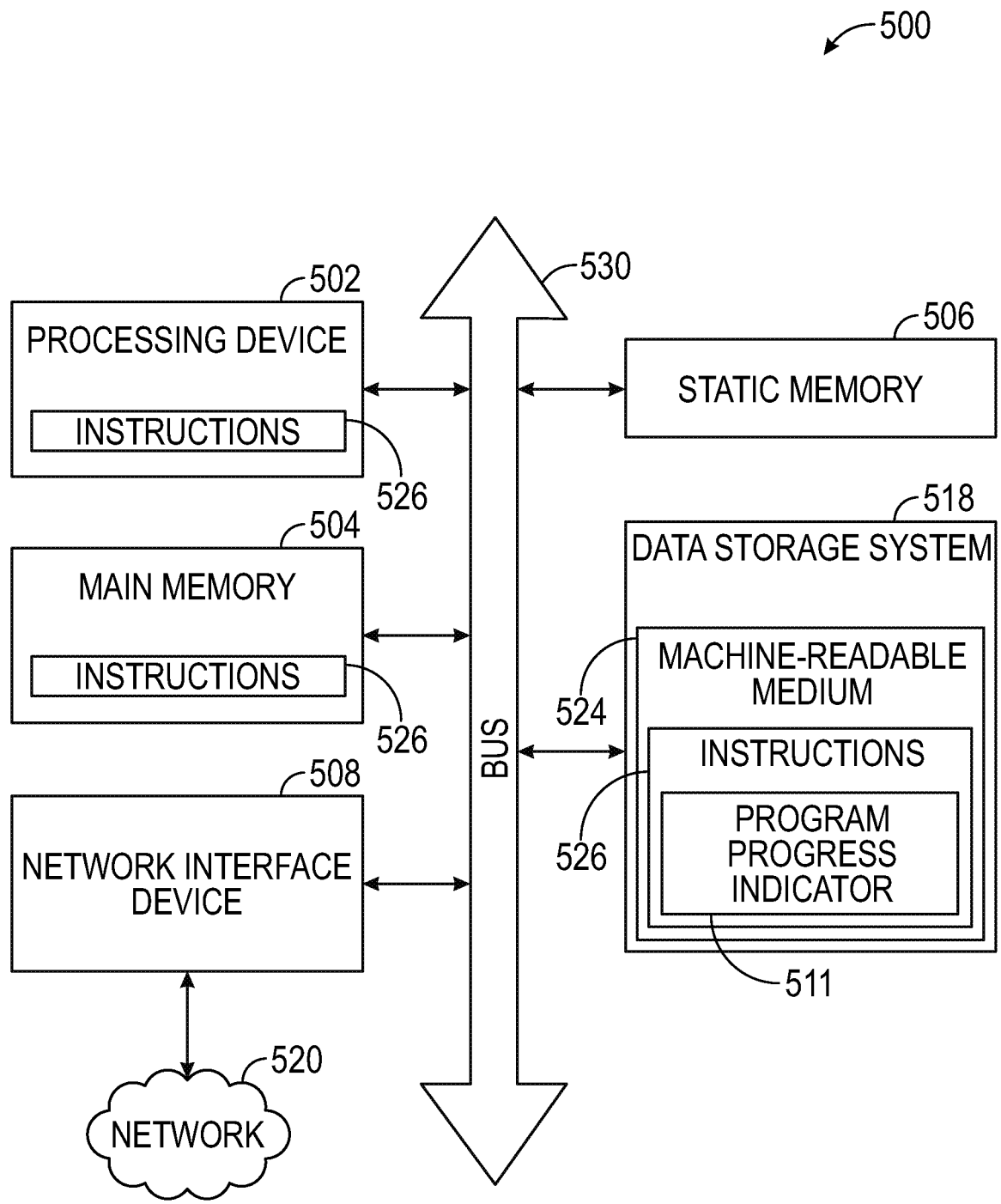
FIG. 5 illustrates a block diagram of an example machine according to some embodiments described herein.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host 105, the memory device 110, etc.) may include a processing device 502 (e.g., a hardware processor, a central processing unit (CPU), a graphics processing unit (GPU), a hardware processor core, or any combination thereof, such as a memory control unit of the memory device 110, etc.), a main memory 504 (e.g., read-only memory (ROM), flash memory, dynamic random-access memory (DRAM) such as synchronous DRAM (SDRAM) or Rambus DRAM (RDRAM), etc.), a static memory 506 (e.g., flash memory, static random-access memory (SRAM), etc.), and a data storage system 518, some or all of which may communicate with each other via an interlink (e.g., bus) 530.

The processing device 502 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 can be configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 or within the processing device 502 during execution thereof by the machine 500, the main memory 504 and the processing device 502 also constituting machine-readable storage media. The machine-readable storage medium 524, the data storage system 518, or the main memory 504 can correspond to the memory device 110 of FIG. 1. In one implementation, the instructions 526 include instructions 511 to implement functionality corresponding to programming according to a program progress indicator (e.g., the Program Progress Indicator 222 of FIG. 2).

While the machine-readable storage medium 524 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 500 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 500 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 526 (e.g., software, programs, an operating system (OS), etc.) or other data are stored on the data storage system 518 can be accessed by the main memory 504 for use by the processing device 502. The main memory 504 (e.g., DRAM) is typically fast, but volatile, and thus a different type of storage than the data storage system 518 (e.g., an SSD), which is suitable for long-term storage, including while in an "off" condition. The instructions 526 or data in use by a user or the machine 500 are typically loaded in the main memory 504 for use by the processing device 502. When the main memory 504 is full, virtual space from the data storage system 518 can be allocated to supplement the main memory 504; however, because the data storage system 518 is typically slower than the main memory 504, and write speeds are typically at least twice as slow as read speeds, use of virtual memory can greatly reduce user experience due to storage device latency (in contrast to the main memory 504, e.g., DRAM). Further, use of the data storage system 518 for virtual memory can greatly reduce the usable lifespan of the data storage system 518.

In contrast to virtual memory, virtual memory compression (e.g., the Linux™ kernel feature "ZRAM") uses part of the memory as compressed block storage to avoid paging to the data storage system 518. Paging takes place in the compressed block until it is necessary to write such data to the data storage system 518. Virtual memory compression increases the usable size of the main memory 504, while reducing wear on the data storage system 518.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 524 may further be transmitted or received over a network 520 using a transmission medium via the network interface device 508 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 508 may include one or more physical jacks (e.g., Ethernet, coaxial, or phone jacks) or one or more antennas to connect to the network 520. In an example, the network interface device 508 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 500, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
   a memory array including multi-level memory cells;
   buffer circuitry;
   a memory control unit operatively coupled to the memory array and configured to load first data into the buffer circuitry and program the multi-level memory cells with the first data using multiple programming passes to program multiple programming levels including a first programming level, one or more intermediate programming levels, and a final programming level;
   a program progress indicator including a program progress register to store a value updated by the memory control unit to indicate completion of each programming level as the programming of the multiple programming levels progresses including the first programming level and the one or more intermediate programming levels; and
   wherein the memory control unit is further configured to load second data for programming of the multi-level memory cells according to an indication of completion of a programming level by the program progress indicator.

2. The memory device of claim 1, wherein the memory control unit is configured to load the second data for programming prior to the program progress register indicating completion of a final programming level of the multiple programming levels.

3. The memory device of claim 1, wherein the memory control unit is configured to:
   initiate programming a first portion of the multi-level memory cells to a first voltage threshold of a first programming level; and
   initiate programming additional portions of the multi-level memory cells to additional voltage thresholds corresponding to additional programming levels, including a final voltage threshold corresponding to a final programming level;
   wherein the program progress indicator is configured to indicate completion of the programming of a voltage threshold level; and
   wherein the memory control unit is further configured to load the second data in response to an indication by the program progress indicator that the final programming level is completed.

4. The memory device of claim 1, including:
   sensing circuitry configured to determine a programmed voltage threshold of a multi-level memory cell;
   wherein the memory control unit is configured to initiate programming of different portions of the multi-level memory cells to different voltage thresholds;
   wherein the program progress indicator is configured to generate an indication of verification of a programmed voltage threshold of the different voltage thresholds; and
   wherein the memory control unit is further configured to load the second data in response to an indication by the program progress indicator of verification of a specified programmed voltage threshold.

5. The memory device of claim 4, wherein the memory control unit is configured to initiate programming of different portions of the multi-level memory cells to one of eight voltage threshold distributions;
   wherein the program progress indicator is configured to present a count corresponding to verification of programming of a corresponding voltage threshold distribution; and
   wherein the memory control unit is configured to load the second data according to a specified count of the program progress indicator.

6. The memory device of claim 1, including:
   sensing circuitry configured to determine a programmed voltage threshold of a multi-level memory cell;
   wherein the program progress indicator is configured to indicate verification of programming of a specified portion of less than all the multi-level memory cells to be programmed.

7. The memory device of claim 1, wherein the memory control unit is configured to initiate erasure of at least a portion of the multi-level memory cells; and
   wherein the program progress indicator is configured to generate an indication of verification of the erasure of the at least a portion of the multi-level memory cells.

8. The memory device of claim 1, wherein the memory control unit is configured to perform a first programming pass to program at least a portion of the multi-level memory cells to a first programming level that is an erase level, and the program progress indicator is configured to generate an indication of completion of the first programming level.

9. The memory device of claim 1, wherein the program progress indicator is configured to generate a count of a number of program passes performed to complete a programming level.

10. A method of programming multi-level memory cells of a memory array, the method comprising:
loading first data into a page buffer;
programming the multi-level memory cells with the first data using multiple programming passes to program multiple programming levels;
updating a value of a program progress indicator in response to completion of programming of each programming level of the multiple programming levels including the first programming level and the one or more intermediate programming levels; and
loading second data into the page buffer for programming of the multi-level memory cells according to the value of the program progress indicator.

11. The method of claim 10, wherein updating the value of the program progress indicator includes:
programming a first portion of the multi-level memory cells to a first voltage threshold of a first programming level;
updating the program progress indicator in response to completion of the programming of the first portion of the multi-level memory cells;
programming additional portions of the multi-level memory cells to additional voltage thresholds corresponding to additional programming levels, including a final voltage threshold corresponding to a final programming level; and
updating the value of the program progress indicator in response to completion of each of the additional programming levels and the final programming level;
wherein loading the second data includes loading the second data into the page buffer in response to the program progress indicator updating to a value indicating completion of a programming level prior to the final programming level.

12. The method of claim 10, including:
programming different portions of the multi-level memory cells to different voltage thresholds;
wherein updating the value of the program progress indicator includes updating the value of the program progress indicator in response to verification of programming of a voltage threshold of the different voltage thresholds.

13. The method of claim 12,
wherein programming different portions of the multi-level memory cells includes programming each of the multi-level memory cells to one of eight voltage threshold distributions;
wherein updating the value of the program progress indicator includes updating the program progress indicator to one of eight specified values in response to verification of programming of a corresponding voltage threshold; and
wherein loading the second data includes loading the second data in response to the program progress indicator being updated to a specified one of the eight specified values.

14. The method of claim 10, wherein updating the value of the program progress indicator includes updating the value of the program progress indicator in response to verification of programming of a specified portion of the multi-level memory cells that is less than all of the memory cells to be programmed.

15. The method of claim 10, including:
erasing at least a portion of the multi-level memory cells; and
updating the program progress indicator to a specified value in response to verification of the erasing of the at least a portion of the multi-level memory cells.

16. The method of claim 10, including performing a first programming pass to program at least a portion of the multi-level memory cells to a first programming level that is an erase level, and wherein updating the value of the program progress indicator includes updating the value of the program progress indicator in response to completion of the first programming level.

17. The method of claim 10, including storing a number of program passes performed between updates to the program progress indicator.

18. A non-transitory computer readable storage medium comprising instructions configured to cause a memory control unit of a memory device to:
load first data into a page buffer for programming of the multi-level memory cells;
initiate multiple programming passes that program the multi-level memory cells;
update a value of a program progress indicator to indicate completion of programming passes and completion of programming of each level of the multiple-level memory cells including a first programming level one or more intermediate programming levels, and a final programming level; and
load second data into the page buffer for programming of the multi-level memory cells according to the value of a program progress indicator.

19. The non-transitory computer readable storage medium of claim 18, further including instructions configured to cause the memory control unit to:
program a first portion of the multi-level memory cells to a first voltage threshold of a first programming level;
program additional portions of the multi-level memory cells to additional voltage thresholds corresponding to additional programming levels, including a final voltage threshold corresponding to a final programming level; and
load the second data into the page buffer in response to the program progress indicator updated to a value of indicating completion of a programming level prior to the final programming level.

20. The non-transitory computer readable storage medium of claim 18, further including instructions configured to cause the memory control unit to:
program different portions of the multi-level memory cells to different voltage thresholds;
read a value of the program progress indicator, wherein the value indicates programming status of the different voltage thresholds; and
load the second data according to a specified value of the program progress indicator.

21. The non-transitory computer readable storage medium of claim 18, further including instructions configured to cause the memory control unit to:
program each of the multi-level memory cells to one of eight voltage threshold distributions;

read the value of the program progress indicator, wherein the value is one of eight specified values indicating verification of programming of a corresponding voltage threshold; and load the second data in response to the program progress indicator being updated to a specified one of the eight specified values.

22. The non-transitory computer readable storage medium of claim 18, further including instructions configured to cause the memory control unit to:

load the second data for programming of the multi-level memory cells in response to reading a value of the program progress indicator indicating verification of programming of a specified portion of less than all the multi-level memory cells to be programmed.

23. The non-transitory computer readable storage medium of claim 18, further including instructions configured to cause the memory control unit to:

erase at least a portion of the multi-level memory cells; and load the first data in response to reading a value of the program progress indicator indicating verification of the erasure of the at least a portion of the multi-level memory cells.

24. The non-transitory computer readable storage medium of claim 18, further including instructions configured to cause the memory control unit to:

perform a first programming pass to program at least a portion of the multi-level memory cells to a first programming level that is an erase level; and load the first data in response to reading a value of the program progress indicator indicating completion of the programming of the at least a portion of the multi-level memory cells to the first programming level.

25. The non-transitory computer readable storage medium of claim 18, further including instructions configured to cause the memory control unit to store a number of program passes performed between updates to the value of the program progress indicator.

* * * * *